United States Patent
Abbott, Jr. et al.

(10) Patent No.: US 9,266,326 B2
(45) Date of Patent: Feb. 23, 2016

(54) PIEZOELECTRIC ACTUATOR AND METHOD OF MAKING A PIEZOELECTRIC ACTUATOR

(75) Inventors: James Elmer Abbott, Jr., Albany, OR (US); Chien-Hua Chen, Corvallis, OR (US); Jeffrey R. Pollard, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/397,333

(22) PCT Filed: Jul. 25, 2012

(86) PCT No.: PCT/US2012/048058
§ 371 (c)(1),
(2), (4) Date: Oct. 27, 2014

(87) PCT Pub. No.: WO2014/018028
PCT Pub. Date: Jan. 30, 2014

(65) Prior Publication Data
US 2015/0138276 A1    May 21, 2015

(51) Int. Cl.
| | | |
|---|---|---|
| *B41J 2/14* | (2006.01) | |
| *B41J 2/145* | (2006.01) | |
| *H01L 41/053* | (2006.01) | |
| *H01L 41/22* | (2013.01) | |
| *B41J 2/16* | (2006.01) | |

(52) U.S. Cl.
CPC ............ *B41J 2/14201* (2013.01); *B41J 2/145* (2013.01); *B41J 2/1618* (2013.01); *B41J 2/1623* (2013.01); *B41J 2/1642* (2013.01); *B41J 2/1646* (2013.01); *H01L 41/053* (2013.01); *H01L 41/22* (2013.01); *Y10T 29/42* (2015.01)

(58) Field of Classification Search
CPC ...... B41J 2/1618; B41J 2/1623; B41J 2/1642; B41J 2/14201; B41J 2/145; B41J 2/1646; H01L 41/22; H01L 41/053
USPC ............................................... 347/40, 54–78
See application file for complete search history.

(56) References Cited

U.S. PATENT DOCUMENTS

| | | | |
|---|---|---|---|
| 6,076,244 | A | 6/2000 | Okumura et al. |
| 7,673,385 | B2 | 3/2010 | Miyoshi |
| 7,760,049 | B2 | 7/2010 | Uno et al. |

(Continued)

FOREIGN PATENT DOCUMENTS

| | | |
|---|---|---|
| CN | 1256663 | 6/2000 |
| CN | 101355134 | 1/2009 |

(Continued)

OTHER PUBLICATIONS

Harris Products Group, Material Safety Data Sheet, Jun. 21, 2002, Harris Products Group, Lead Free Solders MSDS, p. 1.*

(Continued)

*Primary Examiner* — Manish S Shah
*Assistant Examiner* — Roger W Pisha, II
(74) *Attorney, Agent, or Firm* — Hewlett-Packard Patent Department (57) ABSTRACT

In one example, a piezoelectric actuator includes a piezoelectric material, a first conductor on a first part of the piezoelectric material, and a membrane bonded to the first conductor with an adhesive. The first conductor has a root mean square surface roughness of at least 10 nm at the bonding interface with the membrane.

17 Claims, 7 Drawing Sheets

(56) References Cited

U.S. PATENT DOCUMENTS

| | | |
|---|---|---|
| 8,511,800 B2 | 8/2013 | Seki et al. |
| 2002/0095755 A1 | 7/2002 | Tanikawa et al. |
| 2002/0101137 A1 | 8/2002 | Tanikawa et al. |
| 2007/0257580 A1 | 11/2007 | Chen et al. |
| 2007/0279155 A1 | 12/2007 | Uno et al. |
| 2011/0050808 A1* | 3/2011 | Cruz-Uribe et al. ............ 347/68 |

FOREIGN PATENT DOCUMENTS

| | | |
|---|---|---|
| CN | 101484399 | 7/2009 |
| CN | 102476506 | 5/2012 |
| EP | 1376711 | 1/2004 |
| KR | 20050014130 A | 2/2005 |
| WO | 2014018028 A1 | 1/2014 |

OTHER PUBLICATIONS

International Searching Authority, "Search Report", issued in connection with PCT patent application No. PCT/US2012/048058, mailed on Mar. 15, 2013, 5 pages.

International Searching Authority, "Written Opinion", issued in connection with PCT patent application No. PCT/US2012/048058, mailed on Mar. 15, 2013, 4 pages.

Chinese Patent Office, "Office action", issued in connection with Chinese patent application No. 201280072849.9, mailed on Jun. 2, 2015, 9 pages.

Taiwan Patent Office, "Office action", issued in connection with Taiwanese patent application No. 10421382170, mailed on Oct. 15, 2015, 7 pages.

* cited by examiner

PIEZOELECTRIC ACTUATOR AND METHOD OF MAKING A PIEZOELECTRIC ACTUATOR

RELATED APPLICATION

This patent arises from the U.S. national stage of International Patent Application Serial No. PCT/US2012/048058, having an International Filing Date of Jul. 25, 2012, which is hereby incorporated by reference in its entirety.

BACKGROUND

A piezoelectric inkjet printer uses a piezoelectric material actuator to generate a pressure pulse in an ink-filled chamber to force an ink drop out of the chamber. Piezoelectric actuators for an inkjet printhead are fabricated by attaching a piezoelectric material to a membrane that covers pressure chambers in the printhead. Conductors are formed on the piezoelectric material to selectively generate the desired electric fields for deforming the piezoelectric material, which bends the membrane into each of the pressure chambers to force an ink drop out of the chamber.

DRAWINGS

The same part numbers designate the same or similar parts throughout the figures.

DESCRIPTION

The examples shown and described illustrate but do not limit the invention, which is defined in the Claims following this Description.

Adhesive bonding is commonly employed in the fabrication of piezoelectric actuators and other MEMS (micro-electro-mechanical system) devices. A strong and reliable adhesive bond is particularly desirable in piezoelectric actuators where the bond helps transfer mechanical energy from the piezoelectric material to another part. A new rough structure and fabrication process have been developed to help improve the adhesive bond between the piezoelectric material and the membrane in a piezoelectric actuator for an inkjet printhead. The new structure and process, however, are not limited to implementation in an inkjet printhead but might also be implemented in piezoelectric actuators for use in other devices or environments.

In one example of the new structure, a piezoelectric actuator includes a membrane adhesive bonded to one of the conductors on the piezoelectric material. The conductor has a root mean square surface roughness of at least 10 nm at the bonding interface with the membrane. In one implementation particularly well suited to an actuator for an inkjet printhead, the rough surface consists of nickel (Ni) or nickel alloy (e.g., NiV) coated with tin (Sn). In one example of the new fabrication process, the rough conductor surface at the bonding interface is formed by depositing a coating of tin on to a layer of nickel or a nickel alloy and then annealing the structure if necessary or desirable to stabilize the composite film. It is expected that other low melting point metal coatings such as indium (In), zinc (Zn) and lead (Pb) on nickel or other Group 10 or 11 metal conductors that are mobile into the metal coating might also be used to form the desired rough conductor bonding surface.

As used in this document "liquid" means a fluid not composed primarily of a gas or gases, a "membrane" means a pliable sheet or layer, and a "printhead" means that part of an inkjet printer or other inkjet type dispenser that dispenses liquid from one or more openings. A "printhead" is not limited to printing with ink but also includes inkjet type dispensing of other liquids and/or for uses other than printing. Also, as used in this document directional terms such as "top" and "bottom" refer to the orientation of a part shown in the figure being described. The part may have a different orientation in another figure or in a different environment, for example parts may be oriented one way during fabrication but oriented a different way during operation. One part "over" another part includes the part being above, below, or to the side of the other part and, thus, does not depend on any particular orientation of the two parts together. One part "on" another part includes the part being directly on the other part (no intervening part) or indirectly on the other part (an intervening part).

Referring now to the block diagram of FIG. 1, an inkjet printer 10 includes an array 12 of piezoelectric printheads 14 incorporating a new rough structure for improving the bond between the piezoelectric material and the membrane in the piezoelectric actuator, as describe in detail below. Printer 10 also includes an ink supply 16, a print media transport mechanism 18 and a printer controller 20. Controller 20 represents generally the programming, processor(s) and associated memories, and the electronic circuitry and components needed to control the operative elements of printer 10. In operation, printer controller 20 selectively energizes the piezoelectric actuators in the printheads in the appropriate sequence to eject ink on to print media 22 in a pattern corresponding to the desired printed image. Printhead array 12 and ink supply 16 may be housed together as a single unit or they may comprise separate units. Printhead array 12 may be a stationary larger unit (with or without supply 16) spanning the width of print media 22. Alternatively, printhead array 12 may be a smaller unit that is scanned back and forth across the width of media 22 on a moveable carriage.

Figure 1:
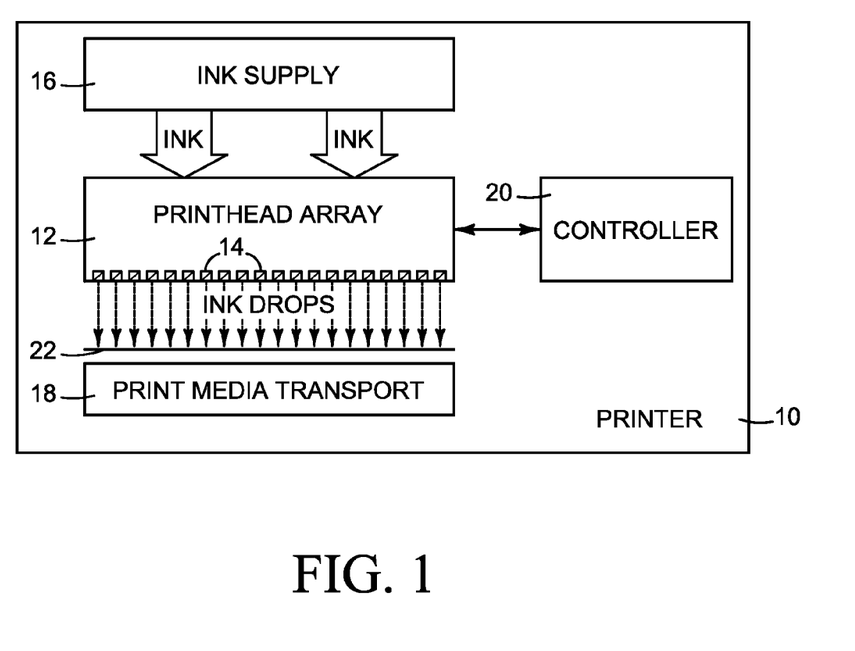
FIG. 1 is a block diagram illustrating an inkjet printer in which examples of a new piezoelectric actuator may be implemented.
Figures 2, 4:
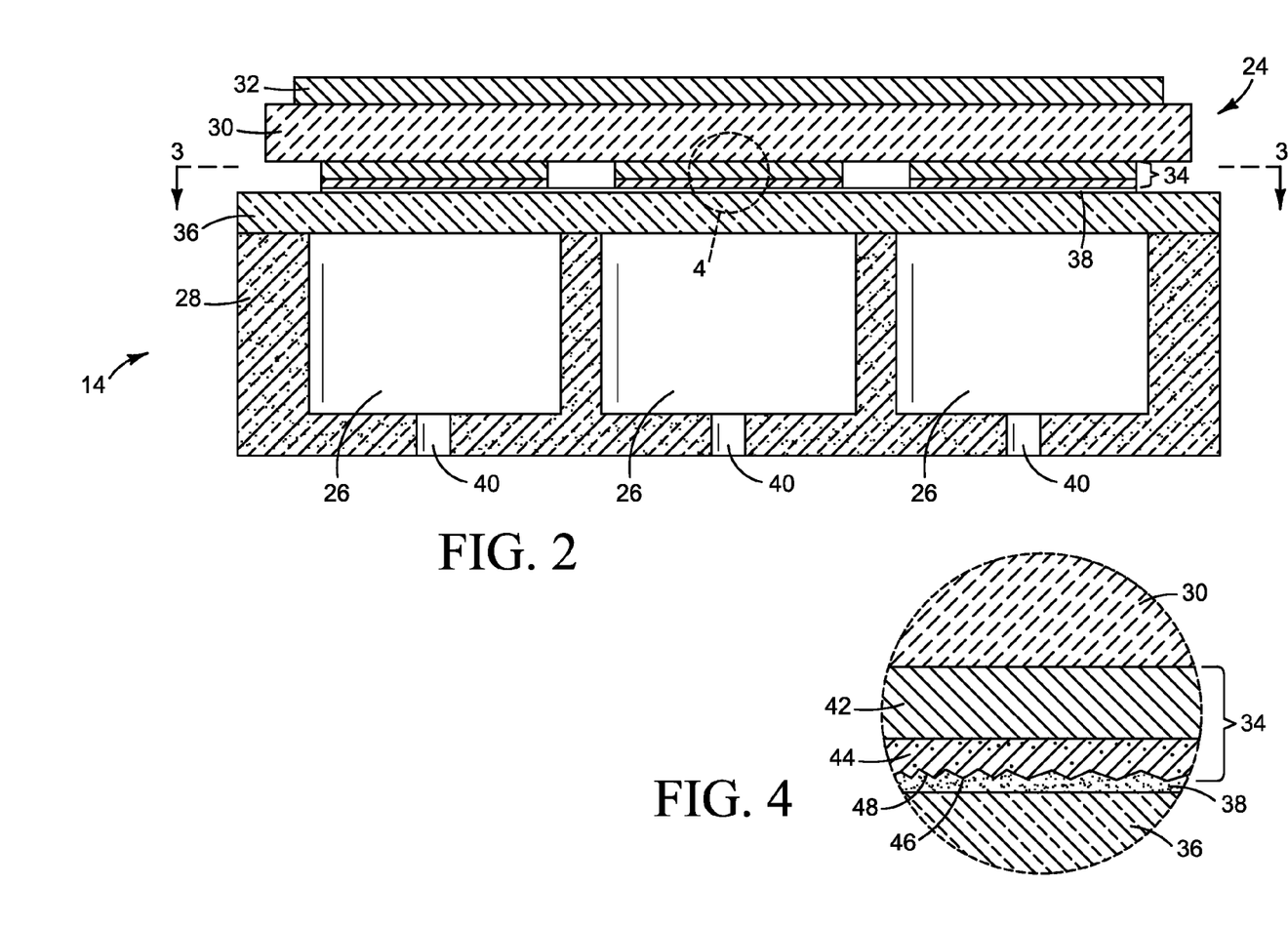
FIGS. 2 and 3 are side and plan section views, respectively, illustrating part of a printhead incorporating one example of the new piezoelectric actuator.
FIG. 4 is a detail view showing one example of the adhesive bond interface between the piezoelectric material and the membrane in the piezoelectric actuator of FIG. 2.
Figure 3:
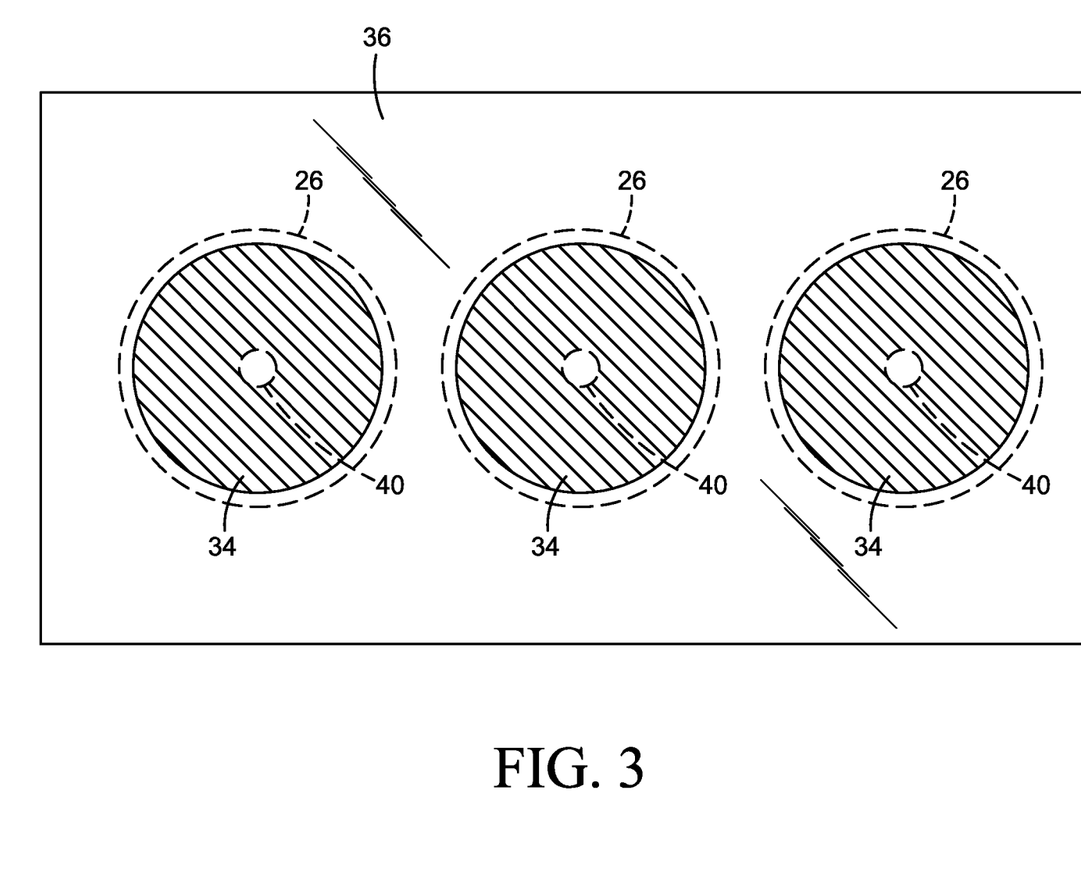

FIGS. 2 and 3 are side and plan section views, respectively, illustrating part of a printhead 14 implementing one example of a new piezoelectric actuator 24, such as might be used in the printer of FIG. 1. FIG. 4 is a detail view taken from FIG. 2 showing one example of the bond interface between the piezoelectric material and the membrane in piezoelectric actuator 24. Referring first to FIGS. 2 and 3, each actuator 24 covers a corresponding pressure chamber 26 in a channel structure 28 through which ink (or other liquid) is supplied to and dispensed from pressure chambers 26. Each actuator 24 includes a piezoceramic plate or other suitable piezoelectric material 30, a common conductor 32 formed on one part of piezoelectric material 30, and individual conductors 34 formed on another part of piezoelectric material 30. In the example shown, piezoelectric material 30 is attached indirectly to a glass sheet or other suitable membrane 36 covering pressure chambers 26 through an adhesive bond 38 between conductors 34 and membrane 36.

Also in the example shown, the common conductor 32 is formed on top of piezoelectric material 30 and individual conductors 34 are formed on the bottom of piezoelectric material 30. Other suitable configurations are possible. For another example, the common conductor may be formed on the bottom of piezoelectric material 30 and, accordingly, the piezoelectric material would be attached to the membrane through the common conductor. As shown in FIG. 3, each individual conductor 34 may be the same shape as each pressure chamber 26, circular in this example. In operation, with pressure chambers 26 filled with ink (or another liquid), a voltage is applied to a particular individual conductor 34 to generate an electric field in the piezoelectric material 30 between the conductor 34 and the common conductor 32. This localized electric field causes the piezoelectric material 30 to deform in the area over the corresponding pressure chamber 26 so that membrane 36 bends into pressure chamber 26 to force ink out through orifice 40.

Referring now to the detail view of FIG. 4, each individual conductor 34 includes a metal base layer 42 and a metal coating 44. Coating 44 is formed with a rough surface 46 at the bonding interface 48 with membrane 36. Surface 46 has an RMS (root mean square) surface roughness of at least 10 nm at bonding interface 48. Testing indicates a lesser roughness is not likely to improve the strength of the bond compared to a conventional bonding surface. In one specific implementation for conductor 34, a nickel or nickel alloy base layer 42 is covered by a tin coating 44. Coating a nickel base layer 42 with tin 44 forms a sufficiently rough surface 46 for a robust adhesive bond to membrane 36. It has been observed that the nickel in base layer 42 is highly mobile into the tin coating. Consequently, some of the nickel in base layer 42 migrates into the tin coating 44, as suggested by the stippling in coating 44 in FIG. 4, to form a bonding interface 48 on conductor 34 that is a mixture of nickel and tin. The composite nickel/tin film can be stabilized through annealing, urging the two metals to mix completely to equilibrium. Still, the nickel concentration is likely to vary through the thickness of coating 44 from a higher concentration near base layer 42 to a lower concentration at surface 46. Although nickel (base layer) migration into the tin (coating) may be beneficial for implementations in which the in-process structure cannot be subjected to high annealing or other processing temperatures, such base layer migration may not be desirable for other implementations.

Figure 5:
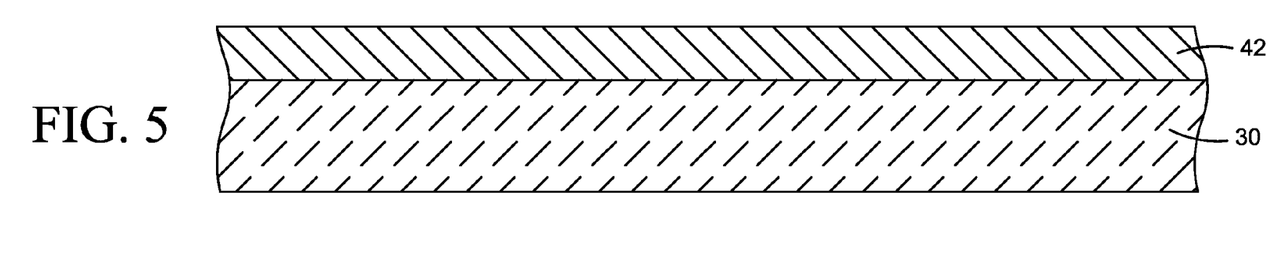
FIG. 5 is a flow diagram illustrating one example of a new method for making a piezoelectric actuator.
Figure 6:
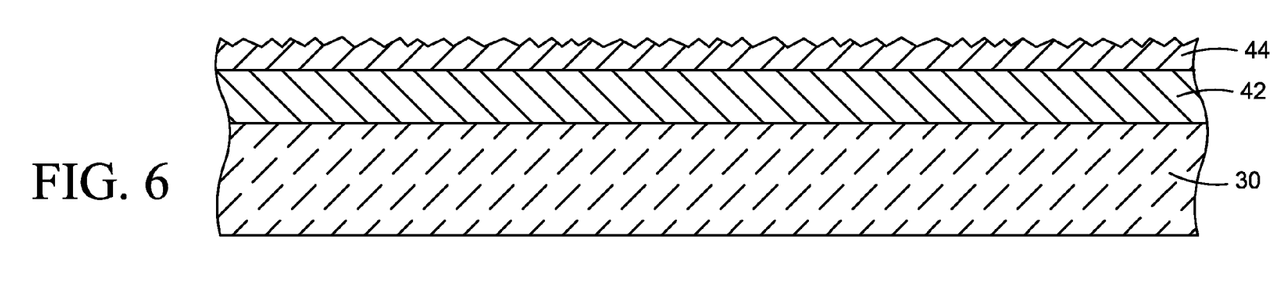
FIGS. 6-11 are section views and FIG. 12 is a flow diagram illustrating another example of a new for method for making a piezoelectric actuator.
Figure 7:
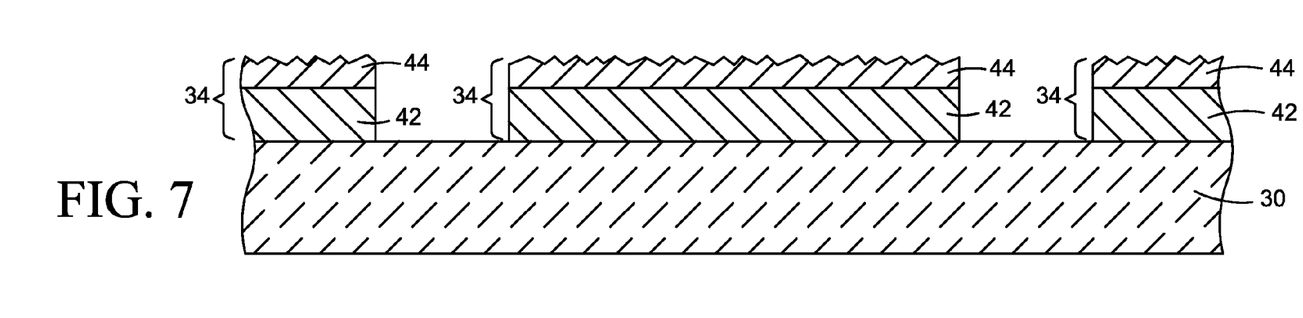
Figure 8:
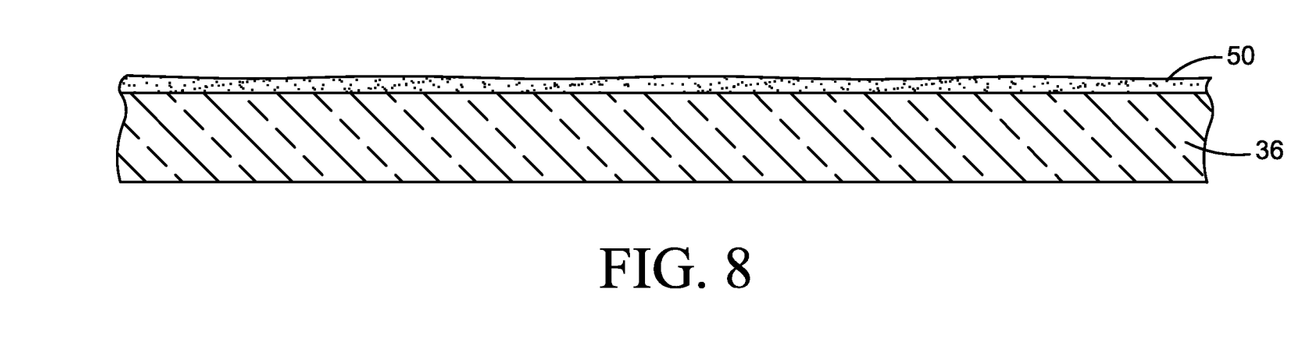

In one example of a new method for fabricating a piezoelectric actuator, shown in the flow diagram of FIG. 5, a conductor is formed on part of a the piezoelectric material (step 102) and a rough surface is formed on an exposed part of the conductor (step 104). Then, the membrane is bonded to the rough surface of the conductor (step 106). Another, more detailed, example for fabricating a piezoelectric actuator such as actuator 24 shown in FIGS. 2-4 will now be described with reference to the section views of FIGS. 6-11 and the process flow diagram of FIG. 12. The orientation of the actuator structures in FIGS. 6-8 is inverted from that shown in FIGS. 2-4 to better illustrate the fabrication process in which structures are usually formed sequentially one on top of another. Referring first to FIG. 6, conductor base metal layer 42 is deposited on a piezoceramic plate 30 (step 108 in FIG. 12). For inkjet printhead applications, a nickel or nickel alloy (e.g., NiCr and NiV) layer 42 is deposited to a thickness of 180 µm to 400 µm on a polished surface of plate 30 using sputter deposition, although other suitable metals, film thickness, and deposition techniques may be used. Also, a thin layer of chromium or titanium is sometimes applied first to improve the adhesion of base metal 42 to piezoceramic plate 30.

Figure 12:
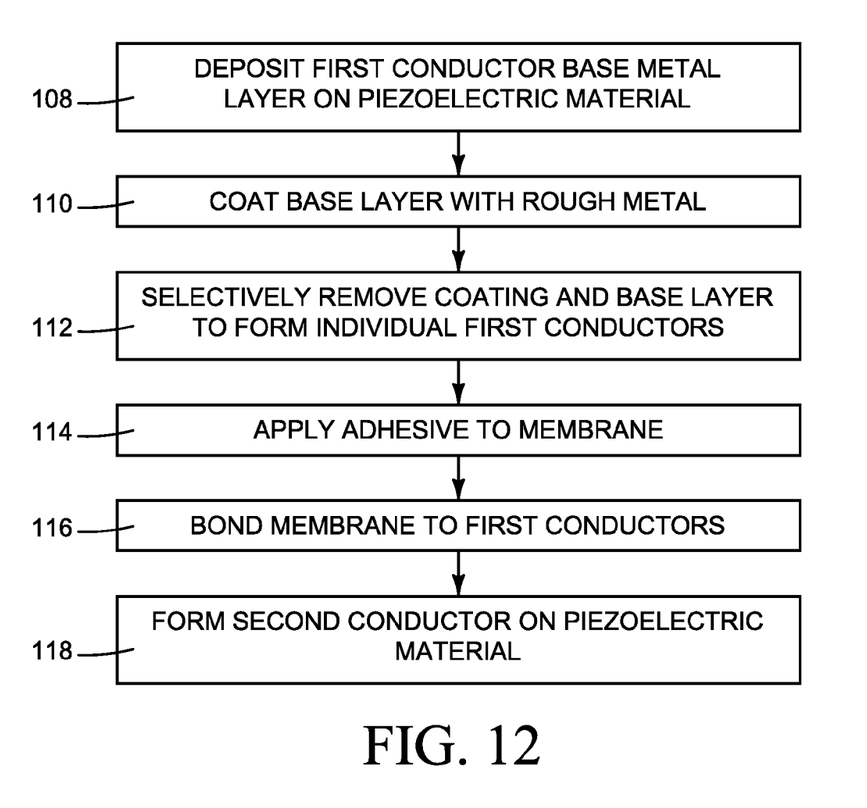

Referring to FIG. 7, base metal 42 is coated with tin or another metal having a suitably low melting temperature (below 1200° C.) to form a rough surface coating 44 on base metal 42 (step 110 in FIG. 12). Coating 44 provides a rough surface 46 for adhesive bonding each conductor 34 to membrane 36. The metal, thickness, and deposition technique for coating 44 are selected to achieve an RMS (root mean square) surface roughness of at least 10 nm along bonding surface 46. As noted above, testing indicates a lesser roughness is unlikely to improve the strength of the bond over a conventional bonding surface. In one specific example process that achieves the desired surface roughness, a tin coating 44 about 1,000 Å thick is formed on a nickel base layer 42 using vacuum deposition under the following conditions:

Pressure=3 mT
Power=500 W
Gas=argon

Vacuum deposition at 150 mT or less for tin coatings are expected to achieve acceptable surface roughness. Other deposition techniques and parameters as well as other materials and material thickness may be found to achieve the desired surface roughness. For example, it is expected that other metal coatings with melting points below 1200° C. such as indium, zinc and lead or other Group 10 or 11 metals or their alloys that migrate easily into the metal coating might also be used to form the desired rough conductor bonding surface.

As noted above, some of the nickel (or other metal) base layer 42 may migrate into coating 44 to form a bonding surface 46 that is a mixture of the two metals. The structure may be annealed as necessary or desired to stabilize coating 44, allowing the two metals to mix completely toward equilibrium. For example, annealing a 1,000 Å tin coating 44 at about 150° C. for about 1 hour is useful to stabilize the migration of the nickel into the tin. It has been observed, however, that a tin coating 44 may be sufficiently rough and provide a suitably robust bond interface without annealing.

Figure 9:
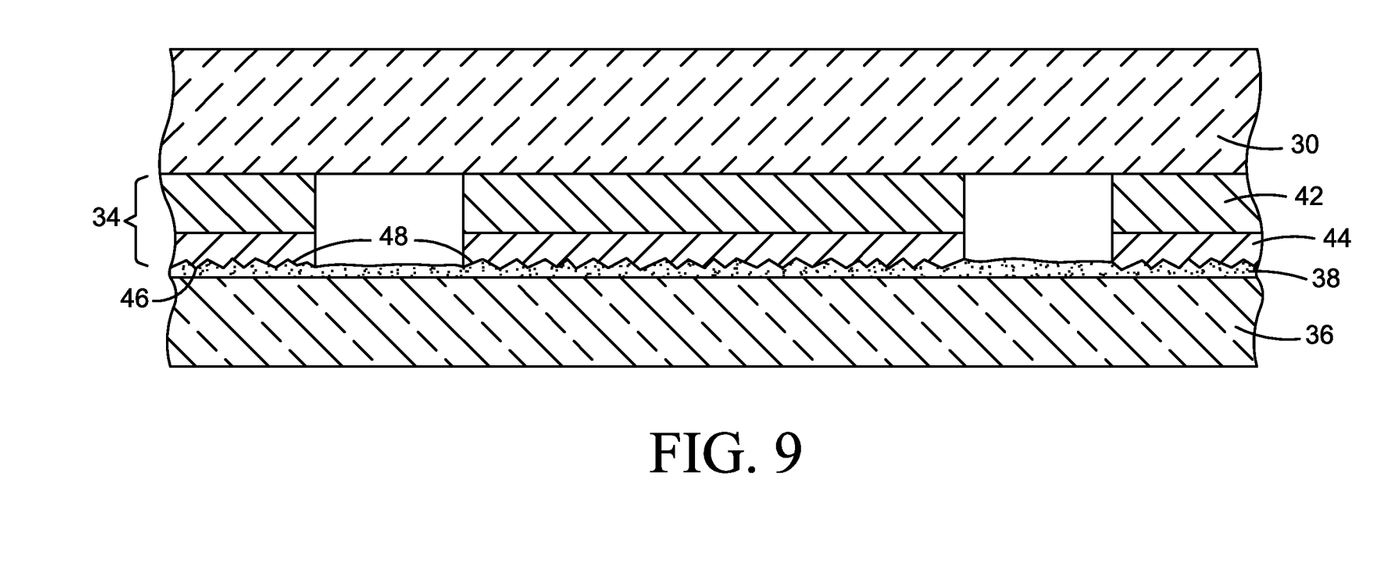
Figure 10:
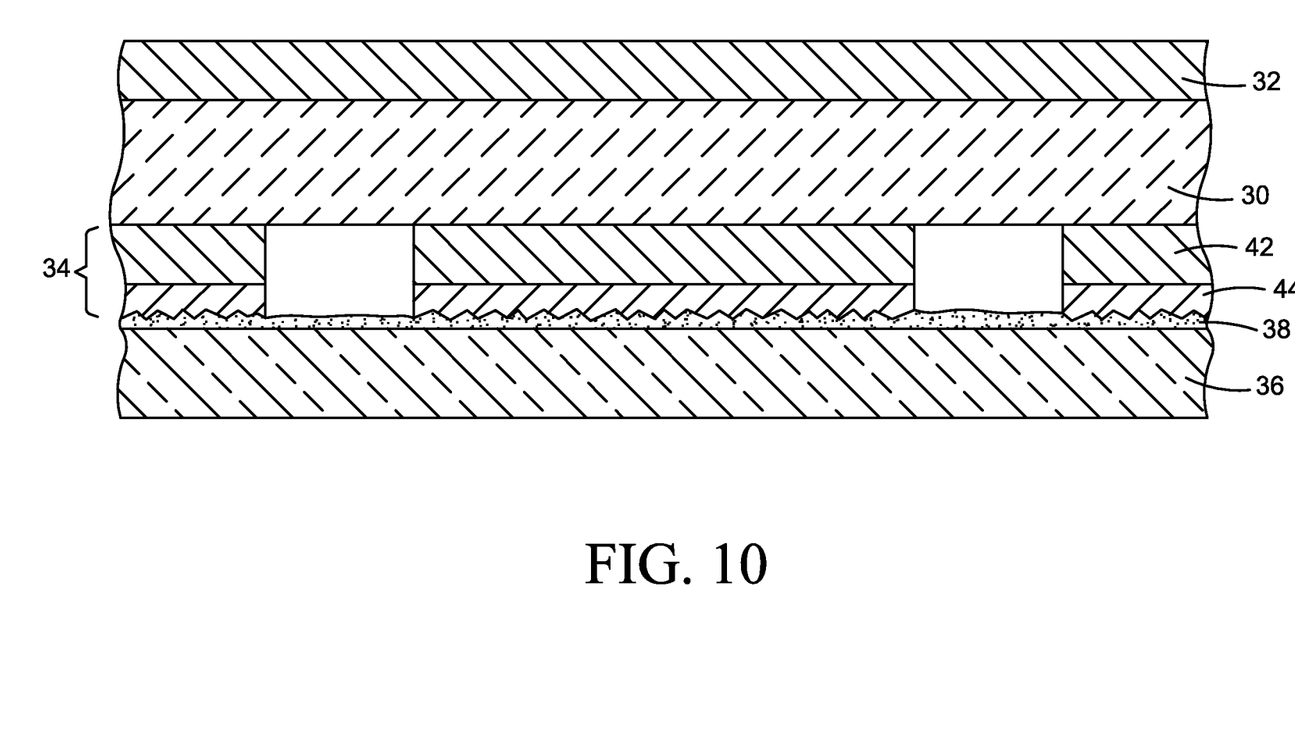
Figure 11:
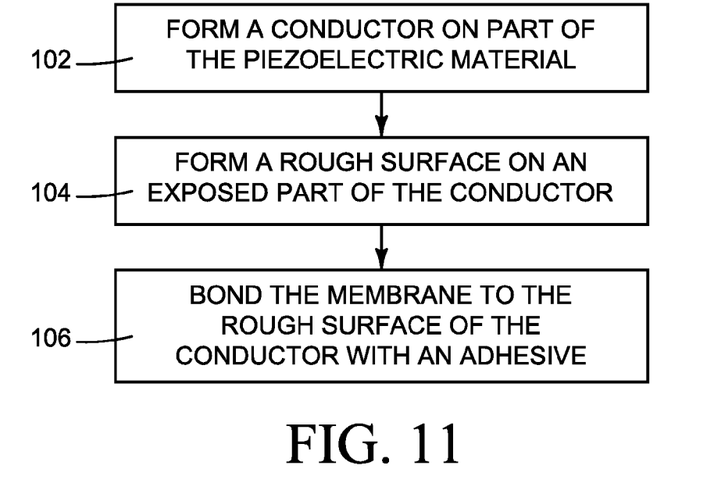

The fabrication of actuator 24 may then be completed using conventional process steps. Referring to FIG. 8, metal layers 42 and 44 are etched or otherwise selectively removed in the desired pattern to form individual conductors 34 (step 112 in FIG. 12). In FIG. 9, a thin layer 50 of a conductive, anisotropic or other suitable adhesive is applied to a glass or other suitable membrane 36 (step 114 in FIG. 12) and the in-process membrane structure 52 is bonded to the in-process piezoelectric structure 54 as shown in FIG. 10 (step 116 in FIG. 12). In FIG. 11, a metal or other suitable common conductor 32 is formed on the top of piezoelectric plate 26 to complete actuator 24 (step 118 in FIG. 12).

As noted at the beginning of this Description, the examples shown in the figures and described above illustrate but do not limit the invention. Other examples are possible. Therefore, the foregoing description should not be construed to limit the scope of the invention, which is defined in the following claims.

What is claimed is:

1. A piezoelectric actuator, comprising:
   a piezoelectric material;
   a first conductor on a first part of the piezoelectric material; and
   a membrane directly bonded to the first conductor with an adhesive at a bonding interface, the first conductor having a root mean square surface roughness of at least 10 nanometers at the bonding interface.

2. The actuator of claim 1, wherein the first conductor includes a metal, and a surface of the first conductor at the bonding interface includes tin.

3. The actuator of claim 2, wherein the surface of the first conductor is at least one of tin or a mixture of tin and nickel.

4. The actuator of claim 3, wherein the first conductor includes a layer of tin on a layer of at least one of the nickel or a nickel alloy.

5. The actuator of claim 1, further including a second conductor on a second part of the piezoelectric material.

6. A method for making the piezoelectric actuator of claim 1, including:
 forming the first conductor on the first part of the piezoelectric material;
 forming a rough surface on an exposed part of the first conductor, the rough surface having the root mean square surface roughness of at least 10 nanometers; and
 bonding the membrane to the rough surface of the first conductor with the adhesive.

7. The method of claim 6, wherein the forming of the rough surface on the exposed part of the first conductor includes depositing a first metal having a melting point less than 1200° C. on to a second metal that is mobile into the first metal.

8. The method of claim 6, wherein the forming of the rough surface on the exposed part of the first conductor includes depositing at least one of tin, indium, zinc or lead on to at least one of a pure or an alloyed Group 10 or 11 metal.

9. The method of claim 8, wherein the forming of the rough surface on the exposed part of the first conductor includes depositing tin on to at least one of nickel or a nickel alloy.

10. The method of claim 6, further including the forming of a second conductor on a second part of the piezoelectric material electrically insulated from the first conductor.

11. The actuator of claim 1, wherein the first conductor is directly on the first part of the piezoelectric material.

12. A piezoelectric printhead, comprising:
 multiple pressure chambers having respective openings through which liquid is to be dispensed from the corresponding pressure chamber;
 a piezoelectric actuator operatively connected to the pressure chambers, the piezoelectric actuator including:
  a piezoelectric material;
  a first conductor on a first part of the piezoelectric material;
  a second conductor on a second part of the piezoelectric material;
  at least one of the first conductor or the second conductor having a bonding surface that includes at least one of tin, indium, zinc or lead; and
  a membrane covering respective parts of the pressure chambers, the membrane bonded with an adhesive to the first conductor or to the second conductor along the bonding surface.

13. The printhead of claim 12, wherein the bonding surface has a root mean square surface roughness of at least 10 nanometers.

14. The printhead of claim 13, wherein the bonding surface is part of a metal coating on a pure or alloyed Group 10 or 11 base metal.

15. The printhead of claim 12, wherein the first conductor is directly on the first part of the piezoelectric material and the second conductor is directly on the second part of the piezoelectric material.

16. The printhead of claim 12, wherein the bonding surface faces away from the piezoelectric material.

17. The printhead of claim 12, wherein the adhesive is directly on the membrane and covers an area spanning over the openings of the multiple pressure chambers.

\* \* \* \* \*